(12) United States Patent
Lee et al.

(10) Patent No.: US 9,253,872 B2
(45) Date of Patent: Feb. 2, 2016

(54) INDUCTOR ASSEMBLY AND CIRCUIT ASSEMBLY

(71) Applicant: Murata Manufacturing Co., Ltd., Nagaokakyo-shi, Kyoto-fu (JP)

(72) Inventors: Hyon K. Lee, Carrollton, TX (US); Daniel P. Brennan, Braintree, MA (US); Richard Paul Cormier, New Bedford, MA (US)

(73) Assignee: Murata Manufacturing Co., Ltd., Kyoto (JP)

( * ) Notice: Subject to any disclaimer, the term of this patent is extended or adjusted under 35 U.S.C. 154(b) by 204 days.

(21) Appl. No.: 13/790,070

(22) Filed: Mar. 8, 2013

(65) Prior Publication Data

US 2014/0092575 A1    Apr. 3, 2014

Related U.S. Application Data

(60) Provisional application No. 61/608,210, filed on Mar. 8, 2012.

(51) Int. Cl.
| | |
|---|---|
| H05K 7/00 | (2006.01) |
| H05K 1/02 | (2006.01) |
| H01F 5/04 | (2006.01) |
| H01F 17/04 | (2006.01) |
| H01F 27/28 | (2006.01) |

(52) U.S. Cl.
CPC ............... *H05K 1/0216* (2013.01); *H01F 5/04* (2013.01); *H01F 17/043* (2013.01); *H01F 27/2852* (2013.01); *H05K 1/0263* (2013.01); *H05K 2201/1003* (2013.01); *H05K 2201/10272* (2013.01)

(58) Field of Classification Search
USPC .................. 361/763–784, 803; 336/199–221
See application file for complete search history.

(56) References Cited

U.S. PATENT DOCUMENTS

| | | | | |
|---|---|---|---|---|
| 5,770,984 | A * | 6/1998 | Raleigh et al. | ............... 333/185 |
| 6,700,793 | B2 * | 3/2004 | Takagawa | ......... H01L 23/49562 |
| | | | | 257/E23.044 |
| 2006/0108663 | A1 | 5/2006 | Sanzo et al. | |
| 2010/0253296 | A1 * | 10/2010 | Huang et al. | .................. 323/225 |
| 2011/0205008 | A1 * | 8/2011 | Brennan | ....................... 336/221 |

FOREIGN PATENT DOCUMENTS

JP         01-232707 A        9/1989

* cited by examiner

*Primary Examiner* — Tuan T Dinh
(74) *Attorney, Agent, or Firm* — Keating & Bennett, LLP

(57) ABSTRACT

An inductor assembly includes an inductor body including an inductor core and a mounting bracket that includes a first leg, a second leg, and a third leg. A portion of the mounting bracket passes through the inductor body, at least one of the first leg and the second leg of the mounting bracket is arranged to be mounted on a substrate, and the third leg of the mounting bracket is arranged to be mounted on an electrical component mounted on the substrate.

15 Claims, 16 Drawing Sheets

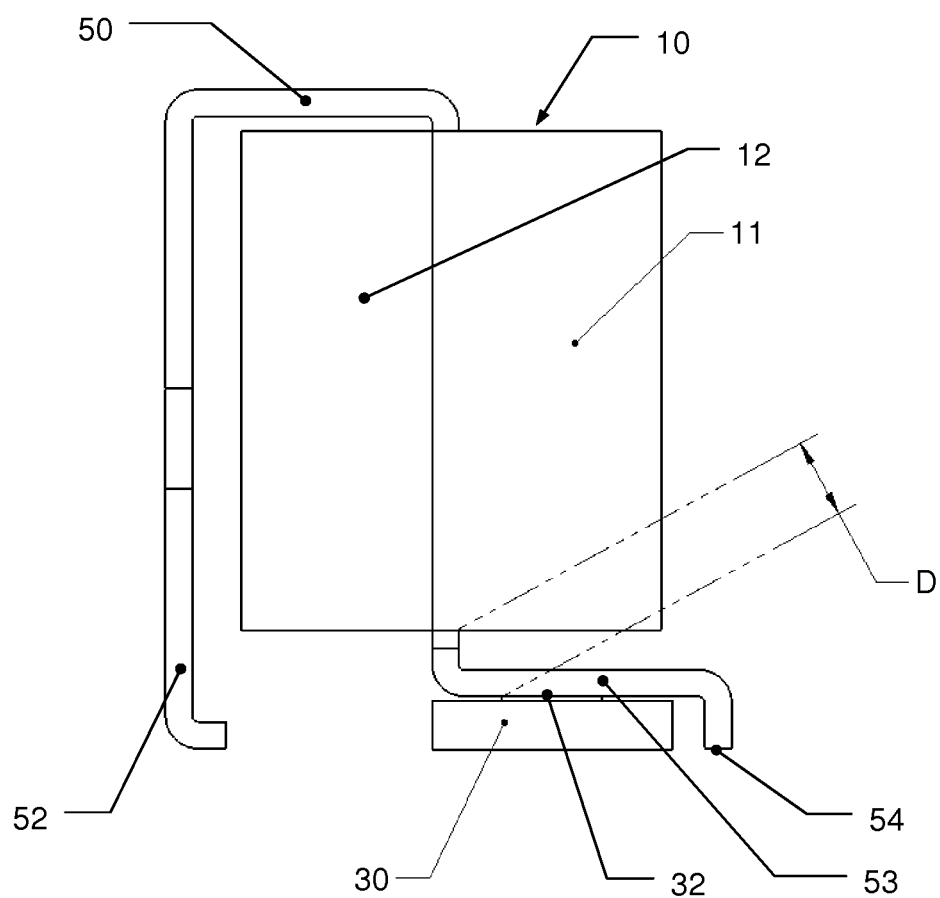

ent from the following detailed description of preferred

INDUCTOR ASSEMBLY AND CIRCUIT ASSEMBLY

BACKGROUND OF THE INVENTION

1. Field of the Invention

The present invention relates to leads for electrical components. More specifically, the present invention relates to leads for inductors that are mounted on other electrical components.

2. Description of the Related Art

In conventional circuits, particularly power supply circuits that are provided on a printed circuit board, inductors are soldered directly to the printed circuit board. Accordingly, copper conductors connect the inductors to other circuit elements, such as a circuit controller, via copper traces on the outer surfaces and/or internal layers of the printed circuit board.

Current paths in circuits, including those current paths created by an inductor, act as antennas, which generate electric power from incident electromagnetic waves and, vice-versa, which generate electromagnetic waves from electric power flowing through the current paths. Long current paths created by soldering an inductor lead or other critical-component lead (e.g., a high-current or noisy lead of a field-effect transistor (FET) or a capacitor) to a printed circuit board allows external noise (e.g., electromagnetic interference (EMI)) to reduce the performance of conventional circuits. More specifically, long current paths permit a greater influence on conventional circuits from external electromagnetic waves generating power (and thus noise) when incident upon the current paths. Similarly, long current paths allow for the generation of electromagnetic waves from electric power flowing through the current paths, which causes a loss of power from the current paths and thereby reduces the performance of conventional circuits.

Furthermore, soldering an inductor lead or other critical-component lead to a printed circuit board creates a high-current path with excessive current drop across the current path on the printed circuit board. Accordingly, due to the current drop across the current path on the printed circuit board, conventional circuits exhibit poor efficiency and generate excessive heat. Furthermore, inductor leads and other critical-component leads inherently include parasitic elements (e.g., parasitic capacitance), and longer leads increase the undesirable effects of parasitic elements.

Japanese Patent Publication No. 01-232707 discloses a conventional inductance line 120, a portion of which is shown in FIG. 14 of the present application. As shown in FIG. 14 of the present application, legs 121 and 122 of the inductance line 120 are arranged to be inserted into corresponding holes of a printed circuit board. Accordingly, when the legs 121 and 122 of the inductance line 120 are inserted into corresponding holes of a printed circuit board (not shown), a long current path is formed that reduces the performance of a circuit that includes the conventional inductance line 120. In particular, a circuit that includes the conventional inductance line 120 may exhibit poor EMI performance and may have low efficiency and generate excessive heat due to a long current path.

SUMMARY OF THE INVENTION

To overcome the problems described above, preferred embodiments of the present invention provide an inductor with a zero-length or near-zero-length lead.

An inductor assembly according to a preferred embodiment of the present invention includes an inductor body including an inductor core and a mounting bracket including a first leg, a second leg, and a third leg. A portion of the mounting bracket passes through the inductor body, at least one of the first leg and the second leg of the mounting bracket is arranged to be mounted on a substrate, and the third leg of the mounting bracket is arranged to be mounted on an electrical component mounted on the substrate.

The third leg is preferably not connected to ground. Preferably, at least one of the first leg, the second leg, and the third leg is arranged at a side of the inductor body opposite to a side of the inductor body that includes another one of the first leg, the second leg, and the third leg. The mounting bracket preferably includes copper or a copper alloy material, and is preferably plated with tin or a tin alloy material.

The mounting bracket is preferably defined by a single monolithic element. The inductor body housing preferably includes a U-shaped or substantially U-shaped core inductor. An end portion of the third leg is preferably arranged to be mounted on the substrate.

A circuit assembly according to a preferred embodiment of the present invention includes a substrate and the inductor assembly, and the inductor assembly is connected to the substrate. The circuit assembly preferably includes an electrical component mounted on the substrate and including a pad on a surface thereof, and the third leg is preferably connected to the pad. An end portion of the third leg is preferably connected to the substrate.

A circuit assembly according to a preferred embodiment of the present invention includes a substrate, an inductor assembly including an inductor body and a mounting bracket, and at least one electronic device including a pad on a surface thereof mounted on the substrate. At least one leg of the mounting bracket is mounted on the substrate, and at least one other leg of the mounting bracket is directly electrically connected to the pad of the electronic device.

The at least one electronic device preferably includes a first electronic device and a second electronic device, the at least one other leg preferably includes a first leg and a second leg, the first leg is preferably mounted on the first electronic device, and the second leg is preferably mounted on the second electronic device.

The at least one electronic device includes a control circuit preferably arranged to switch at least one switching element. Preferably, the at least one switching element is a transistor or a field-effect transistor. Preferably, the at least one electronic device is a diode. Preferably, the circuit assembly is a DC-to-DC converter or a buck converter. An end portion of the at least one other leg of the mounting bracket is preferably mounted on the substrate.

The above and other features, elements, characteristics and advantages of the present invention will become more apparent from the following detailed description of preferred embodiments of the present invention with reference to the attached drawings.

BRIEF DESCRIPTION OF THE DRAWINGS

FIG. 5B is a side view of the inductor, the mounting bracket, and the controller device shown in FIG. 5A.

DETAILED DESCRIPTION OF PREFERRED EMBODIMENTS

Preferred embodiments of the present invention will now be described in detail with reference to FIGS. 1A-13C. Note that the following description is in all aspects illustrative and not restrictive, and should not be construed to restrict the applications or uses of preferred embodiments of the present invention in any manner.

Figure 1A:
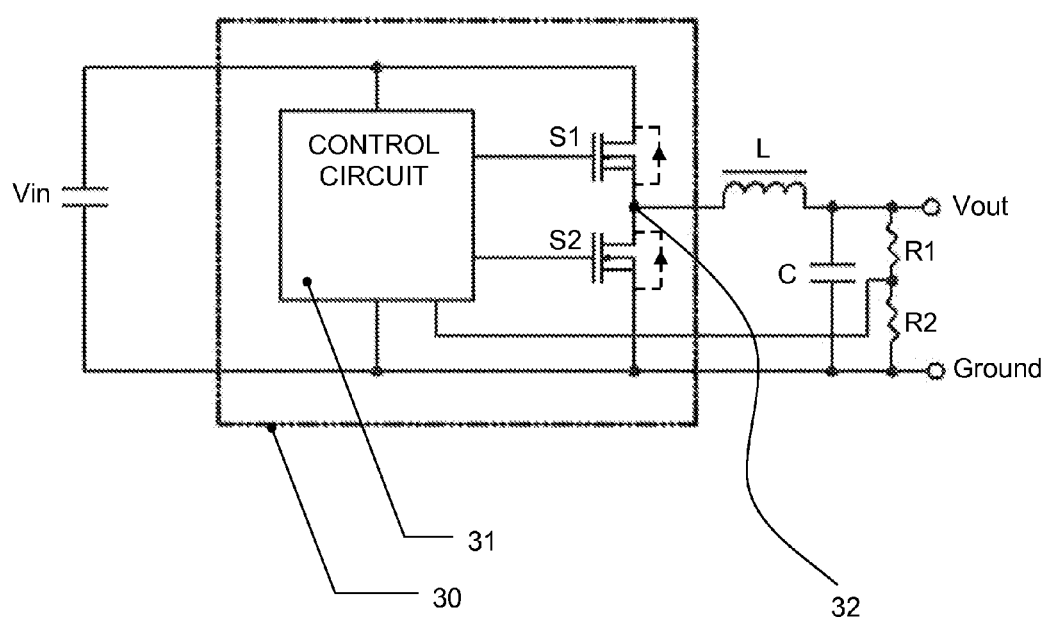
FIGS. 1A and 1B are diagrams of power supply circuits according to preferred embodiments of the present invention.
Figure 1B:
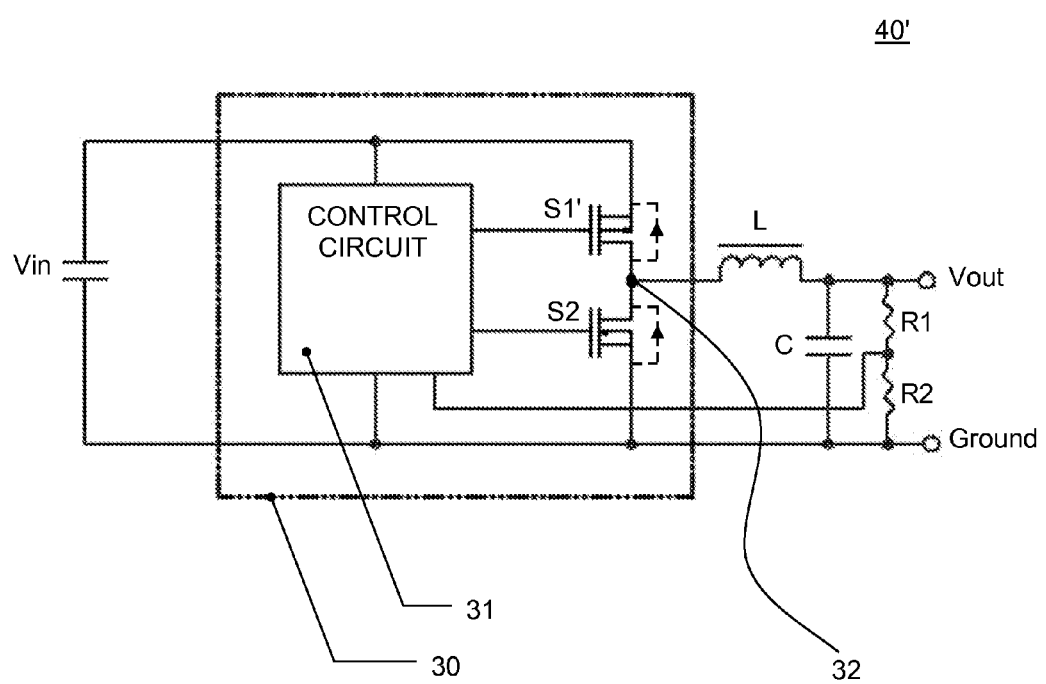

FIGS. 1A and 1B show diagrams of power supply circuits 40 and 40' according to some of the preferred embodiments of the present invention. The specific elements and arrangement of components included in the power supply circuits 40 and 40' are provided only as examples. The preferred embodiments of the present invention as described herein are not limited thereto, and may be applied to circuit arrangements other than that which is shown in the examples of FIGS. 1A and 1B. As shown in FIGS. 1A and 1B, the power supply circuits 40 and 40' receive an input voltage Vin and output an output voltage Vout. The power supply circuits 40 and 40' preferably include a controller device 30, an inductor L, a capacitor C, a first resistor R1, and a second resistor R2. The controller device 30 preferably includes a control circuit 31, a first switching element S1 or S1', and a second switching element S2. The control circuit 31 is preferably an integrated circuit (IC), and more preferably, the controller device 30 preferably is an IC that includes the control circuit 31, the first switching element S1 or S1', and the second switching element S2. The IC includes a pad on the top surface of the IC. The pad is preferably arranged as the contact pad 32 as shown in FIGS. 1A and 1B. However, the pad for the IC can provide an electrical connection to another point in the circuitry of the controller device 30 instead of a point between the first switching element S1 or S1' and the second switching element S2. The pad may be positioned at a location other than the top of the IC, for example, at a side of the IC. Further, the IC can be any type of IC and is not limited to being a control IC such as the controller device 30 shown in FIGS. 1A and 1B.

The first switching element S1 or S1' and the second switching element S2 are preferably connected in series, such that the inductor L is arranged at a contact pad 32 between the first switching element S1 or S1' and second switching element S2. According to one preferred embodiment, as shown in FIG. 1A, both the first switching element S1 and the second switching element S2 of the power supply circuit 40 are preferably N-channel field-effect transistors (FETs). According to another preferred embodiment, as shown in FIG. 1B, the first switching element S1' of the power supply circuit 40' is preferably a P-channel FET, and the second switching element S2 is preferably an N-channel FET. The first switching element S1 or S1' and the second switching element S2 are preferably formed as metal-oxide-semiconductor field-effect transistors (MOSFETs), although other types of FETs may be used for the first switching element S1 or S1' and the second switching element S2. Further, any one of the first switching element S1 or S1' and the second switching elements S2 may be replaced with a diode or with a diode and a transistor, for example. In FIGS. 1A and 1B, optional diodes are shown connected in parallel with the first switching element S1 or S1' and the second switching element S2 using broken lines.

The inductor L and the capacitor C are preferably arranged to filter the output voltage Vout. The first resistor R1 and the second resistor R2 provide a voltage divider across the output voltage Vout, and the voltage at the point between the first resistor R1 and the second resistor R2 is used as a feedback reference voltage by the control circuit 31.

According to the feedback reference voltage, the control circuit 31 controls the first switching element S1 or S1' and the second switching element S2 to turn ON or OFF. The first switching element S1 or S1' and the second switching element S2 are preferably controlled such that the first switching element S1 or S1' and the second switching element S2 are not both ON at the same time, which would result in power loss by the power supply circuit 40 or 40'.

FIGS. 2A-3, 5A, 5B, and 7-13C show an inductor 10 according to various preferred embodiments of the present invention. In particular, the inductor 10 shown in FIGS. 2A-3, 5A, 5B, and 7-13C is preferably used as the inductor L shown in FIGS. 1A and 1B.

As shown in FIGS. 2A-3, 5A, 5B, 7, and 8, the inductor 10 includes a first inductor body 11, a second inductor body 12, and a gap 13 formed between the first inductor body 11 and the second inductor body 12. The gap 13 is arranged to receive a mounting bracket for the inductor 10, as further described herein, such that the mounting bracket is used as the winding of the inductor 10. The gap 13 may be provided by a slot formed in the first inductor body 11, the second inductor body 12, or both the first and second inductor bodies 11 and 12. The first inductor body 11 and the second inductor body 12 include an inductor core that strengthens the magnetic field produced by the mounting bracket. Preferably, the inductor core includes a first core that is preferably U-shaped or C-shaped and a second core that is preferably U-shaped, C-shaped, or I-shaped such that the first core and the second core may be connected to provide a closed core around the gap 13.

Figure 2A:
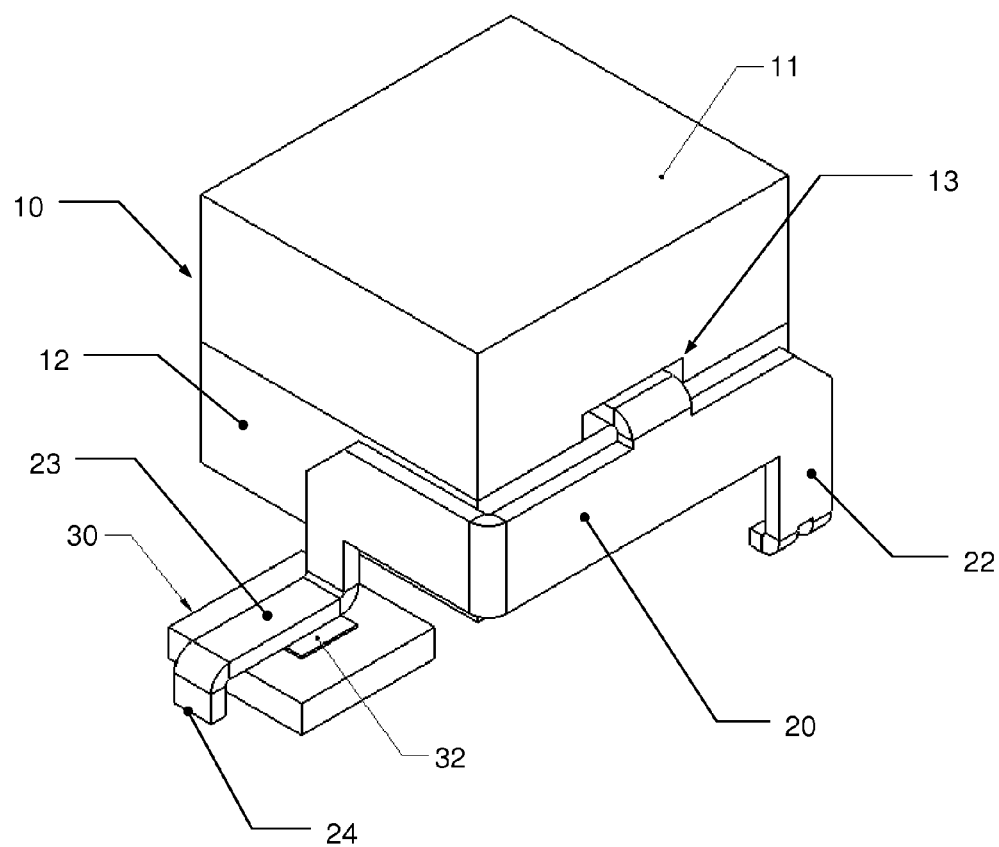
FIG. 2A is a top perspective view of an inductor and a mounting bracket arranged on a controller device according to a preferred embodiment of the present invention.
Figure 2B:
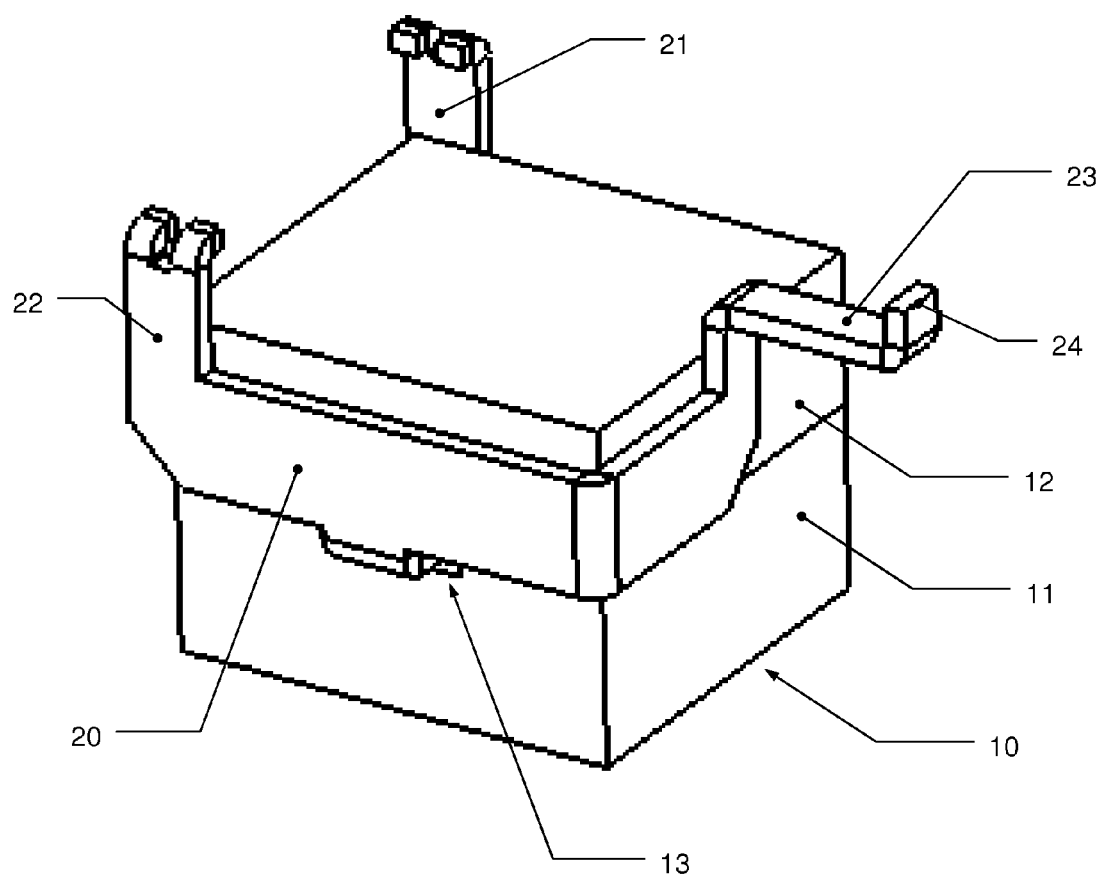
FIG. 2B is a bottom perspective view of the inductor and the mounting bracket shown in FIG. 2A.
Figure 3:
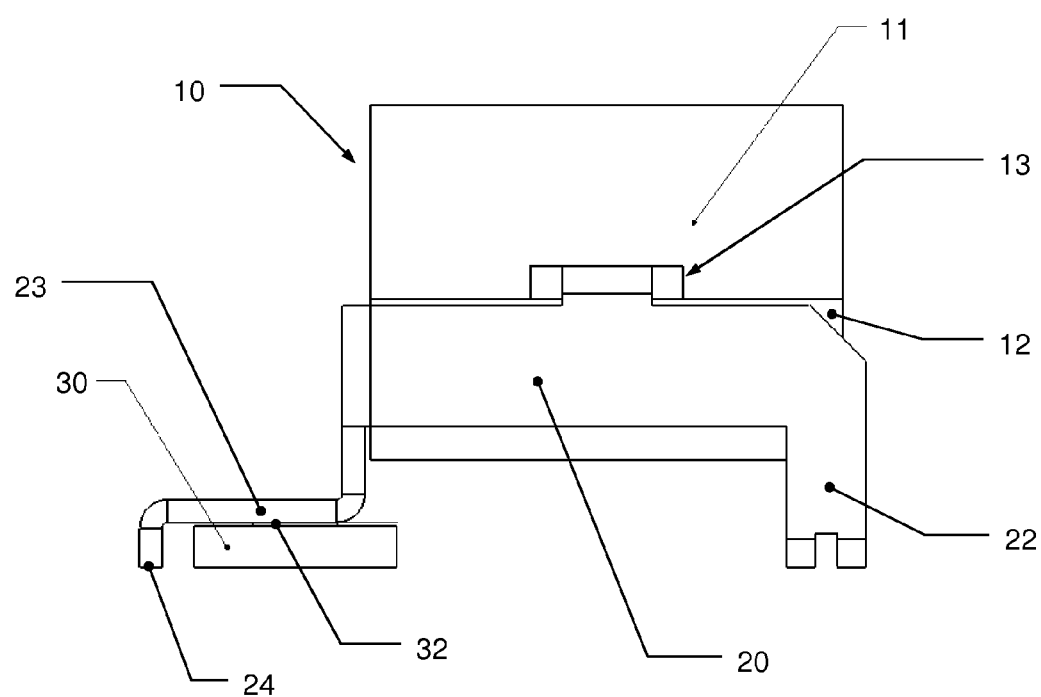
FIG. 3 is a side view of the inductor, the mounting bracket, and the controller device shown in FIG. 2A.
Figure 4:
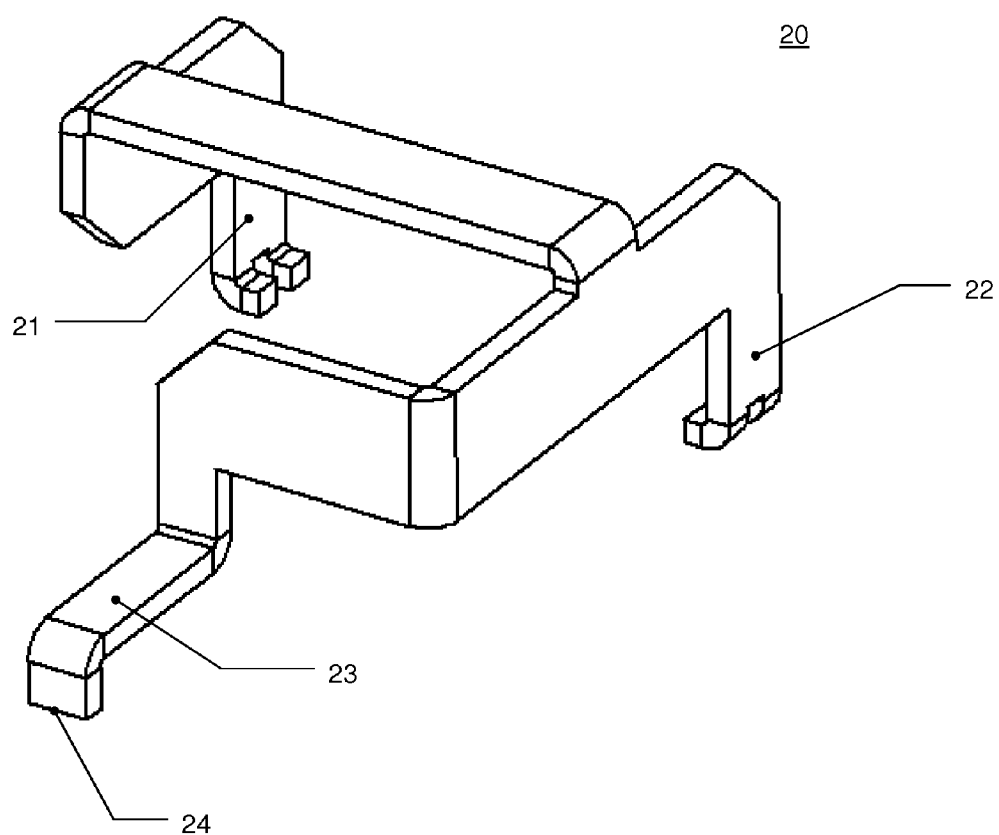
FIG. 4 is a top perspective view of the mounting bracket shown in FIG. 2A.

FIGS. 2A-4 show the inductor 10 with a mounting bracket 20 according to a preferred embodiment of the present invention. FIG. 2A is a top perspective view of the inductor 10 and the mounting bracket 20 arranged on the controller device 30 of FIGS. 1A and 1B. FIG. 2B is a bottom perspective view of the inductor 10 and the mounting bracket 20 shown in FIG. 2A. FIG. 3 is a side view of the inductor 10, the mounting bracket 20, and the controller device 30 shown in FIG. 2A. FIG. 4 is a top perspective view of the mounting bracket 20 shown in FIG. 2A.

As shown in FIGS. 2A-4, the mounting bracket 20 includes a first leg 21, a second leg 22, and a third leg 23. Preferably, the first leg 21, second leg 22, and third leg 23 are arranged at different positions with respect to the inductor 10 (for example, at different sides or at different corners of the inductor 10) to help ensure a stable and secure mechanical and electrical connection between the inductor 10 and the controller device 30, and between the inductor 10 and a substrate (such as a printed circuit board) upon which the inductor 10 is mounted. More specifically, the first leg 21 and the second leg 22 are preferably arranged to be connected to the substrate, and the third leg 23 is preferably arranged to be connected to the contact pad 32 of the controller device 30. Preferably, a third leg support 24 at the end of the third leg 23 is arranged to be connected to the substrate to mechanically support the inductor 10 so that pressure is not applied to the contact pad 32 because the third leg 23 floats on a bed of solder over the contact pad 32. Accordingly, the third leg 23 provides a zero-length or near-zero-length lead for connecting the inductor 10 to the controller device 30. As noted above, the present invention is not limited to the controller device 30, and the third leg 23 may be arranged on any IC that includes a pad on a surface thereof.

Typically, the third leg 23 is preferably soldered to the contact pad 32. Preferably, the contact pad 32 of the controller device 30 includes a fusible material, for example, solder, that provides a mechanical and electrical connection between the controller device 30 and the inductor 10, via the third leg 23 of the mounting bracket 20. Instead of including solder on the contact pad 32, any other fusible material could be used to provide the mechanical and electrical connection. Instead of having the solder on the contact pad 32, the fusible material or solder could be provided on the third leg 23. The first leg 21, the second leg 22, the third leg support 24, and the controller device 30 are preferably soldered to a substrate (such as a printed circuit board) using a similar mechanical and electrical connection. However, it is possible to use other attachments for the mechanical connection and the electrical connection between the third leg 23 and the contact pad 32, between the first leg 21 and the substrate, and between the second leg 22 and the substrate, including, for example, through-hole connections.

As shown in FIGS. 2A and 3, the segment, or lead, of the high-current path between the inductor 10 and the controller device 30 is short. Accordingly, a circuit (including, for example, the power supply circuit 40) using the inductor 10 can have a short high-current path between the inductor 10 and the controller device 30 so as to provide good EMI performance, high efficiency, and reduced heat generation and parasitic elements.

Although FIGS. 2A and 3 show a short distance between the inductor 10 and the controller device 30, the inductor 10 may be arranged directly adjacent to the controller device 30. In particular, the first inductor body 11 and the second inductor body 12 may be arranged to touch the controller device 30, such that the gap 13 is directly adjacent to the contact pad 32, in order to reduce the distance between the inductor 10 and the controller device 30 to zero or nearly zero, within manufacturing tolerances.

Figure 5A:
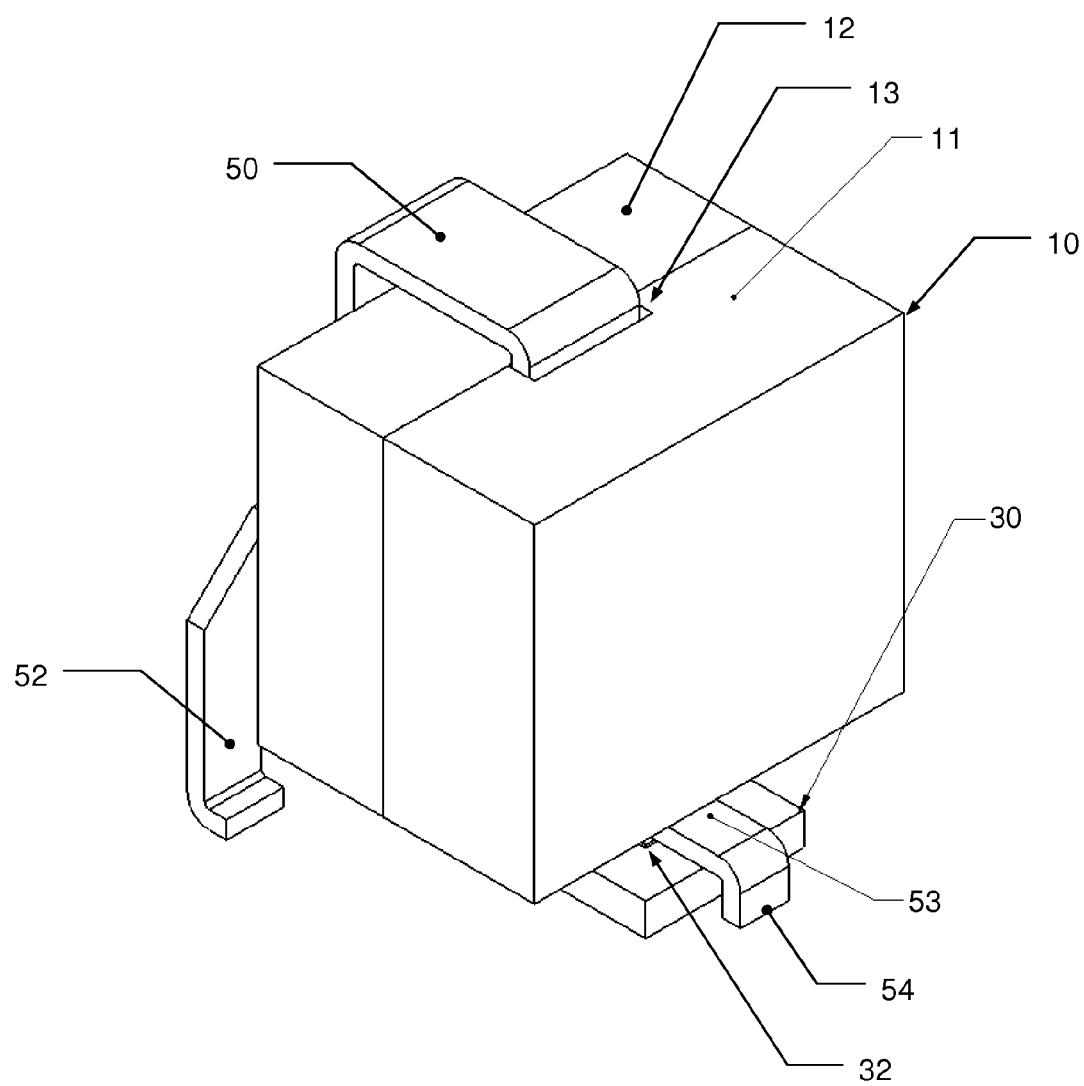
FIG. 5A is a top perspective view of an inductor and a mounting bracket arranged on a controller device according to a preferred embodiment of the present invention.
Figure 6:
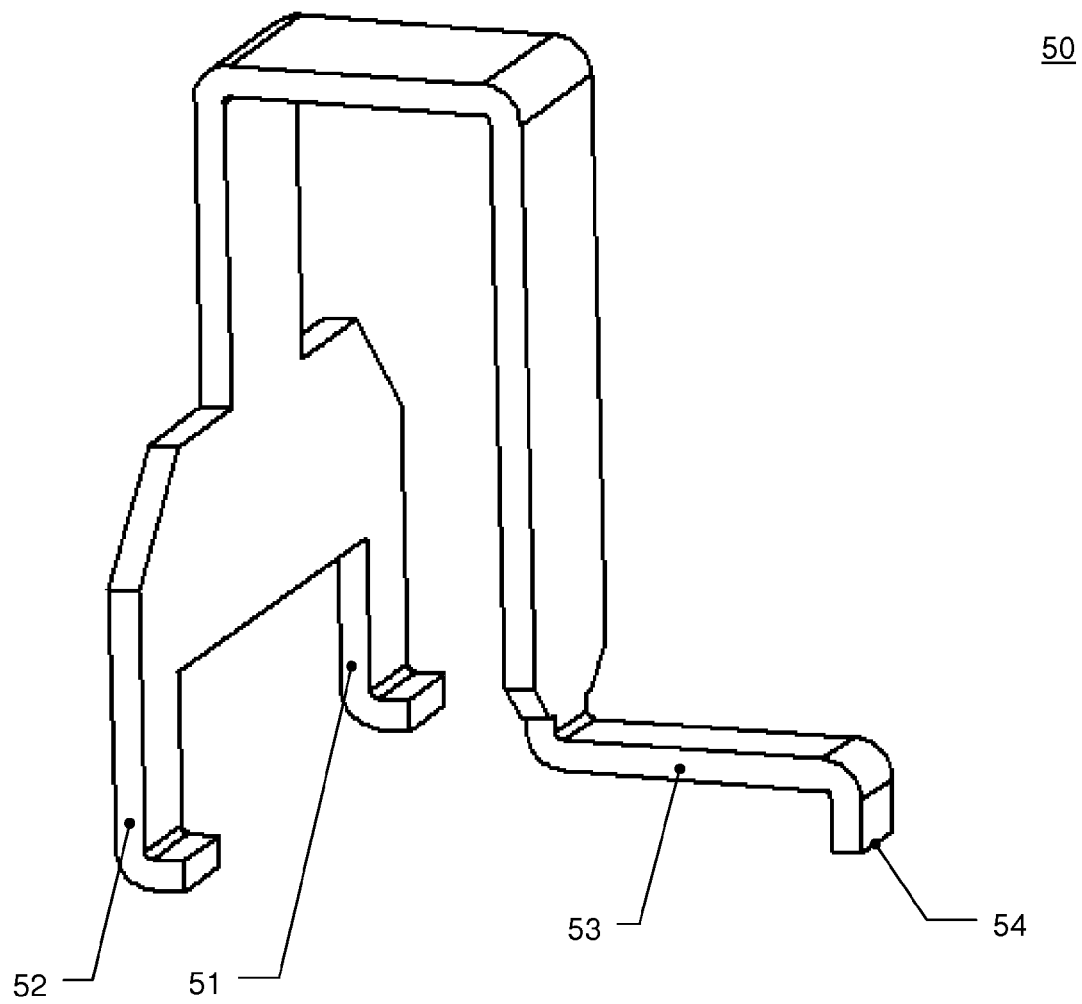
FIG. 6 is a top perspective view of the mounting bracket shown in FIG. 5A.
Figure 9A:
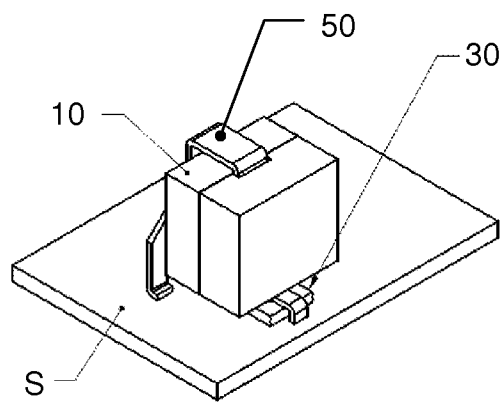
FIGS. 9A-9C show the inductor, the mounting bracket, and the controller device shown in FIG. 5A arranged on a substrate.
Figure 9B:
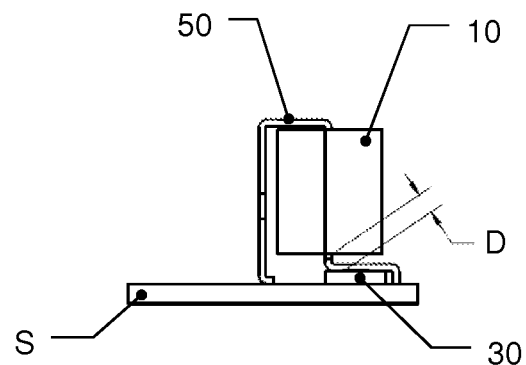
Figure 9C:
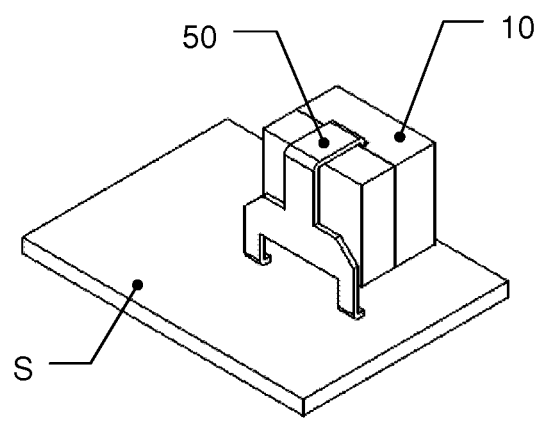

FIGS. 5A-6 and 9A-9C show the inductor 10 with a mounting bracket 50 according to a preferred embodiment of the present invention. FIG. 5A is a top perspective view of the inductor 10 and the mounting bracket 50 arranged on the controller device 30 of FIGS. 1A and 1B. FIG. 5B is a side view of the inductor 10, the mounting bracket 50, and the controller device 30 shown in FIG. 5A. FIG. 6 is a top perspective view of the mounting bracket 50 shown in FIG. 5A. FIGS. 9A-9C show the inductor 10, the mounting bracket 50, and the controller device 30 shown in FIG. 5A arranged on a substrate S.

As shown in FIGS. 5A-6 and 9A-9C, the mounting bracket 50 includes a first leg 51, a second leg 52, and a third leg 53. Preferably, the first leg 51, second leg 52, and third leg 53 are arranged at different positions with respect to the inductor 10 (for example, at different sides or at different corners of the inductor 10) to help ensure a stable and secure mechanical and electrical connection between the inductor 10 and the controller device 30, and between the inductor 10 and the substrate S (e.g., a printed circuit board) upon which the inductor 10 is mounted. More specifically, the first leg 51 and the second leg 52 are preferably arranged to be connected to the substrate S, and the third leg 53 is preferably arranged to be connected to the contact pad 32 of the controller device 30. Preferably, a third leg support 54 at the end of the third leg 53 is arranged to be connected to the substrate S to mechanically support the inductor 10 so that pressure is not applied to the contact pad 32. Accordingly, the third leg 53 provides a zero-length or near-zero-length lead to connect the inductor 10 to the controller device 30. As noted above, the present invention is not limited to the controller device 30, and the third leg 53 may be arranged on any IC that includes a pad on the surface thereof.

The first leg 51, second leg 52, third leg 53, and the third leg support 54 of the mounting bracket 50 are preferably electrically and mechanically connected to the contact pad 32 of the controller device 30 and the substrate S using a connection similar to that described above with regard to the mounting bracket 20.

As compared with the mounting bracket 20 shown in FIGS. 2A-4, the mounting bracket 50 shown in FIGS. 5A-6 allows the inductor 10 to be mounted in a vertical arrangement to reduce the length of the high-current path between the inductor 10 and the controller device 30. More specifically, as shown in FIGS. 5B and 9A-9C, the exposed segment D, or lead, of the high-current path in the third leg 53 is short. Accordingly, due to the short length of the exposed segment D, a circuit (including, for example, the power supply circuit 40) using the inductor 10 can have a short high-current path between the inductor 10 and the controller device 30 so as to provide good EMI performance, high efficiency, and reduced heat generation and parasitic elements.

Although FIG. 5B shows a short distance between the inductor 10 and the controller device 30, the inductor 10 may be arranged directly adjacent to the controller device 30. In particular, the first inductor body 11 and the second inductor body 12 may be arranged to touch the controller device 30, such that the gap 13 is directly adjacent to the contact pad 32, in order to reduce the distance between the inductor 10 and the controller device 30 to zero or nearly zero, within manufacturing tolerances.

Figure 7:
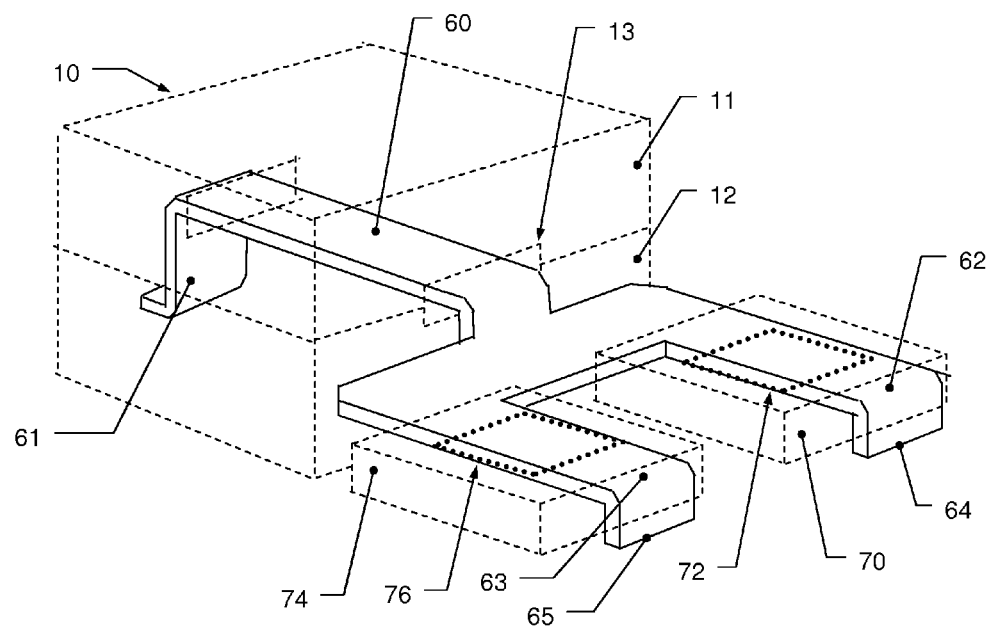
FIG. 7 is top perspective view of an inductor and a mounting bracket arranged on first and second controller devices according to a preferred embodiment of the present invention.
Figure 10A:
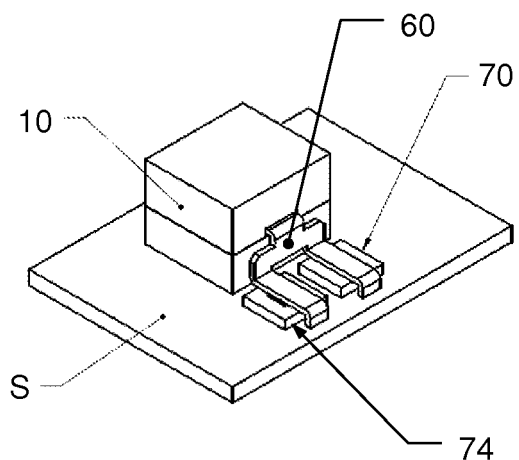
FIGS. 10A-10C show the inductor, the mounting bracket, the first controller device, and the second controller device shown in FIG. 7 arranged on a substrate.
Figure 10B:
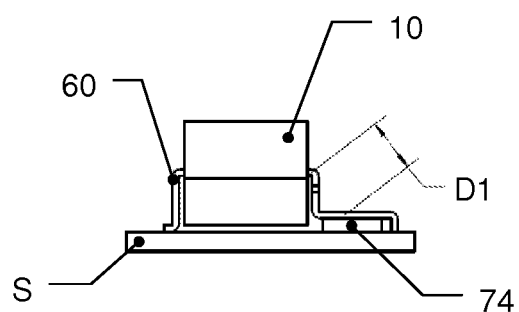
Figure 10C:
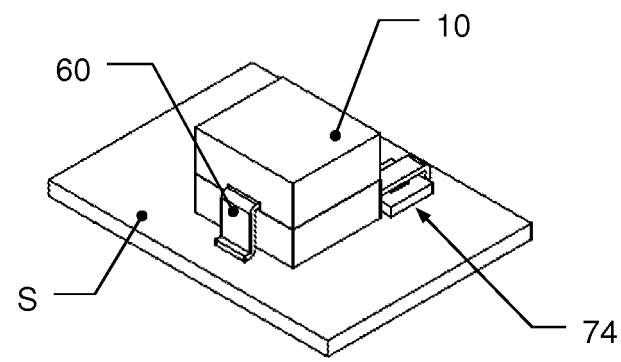

FIGS. 7 and 10A-10C show the inductor 10 with a mounting bracket 60 according to a preferred embodiment of the present invention. In particular, FIG. 7 is a top perspective view of the inductor 10 and the mounting bracket 60 arranged on a first controller device 70 and a second controller device 74. FIGS. 10A-10C show the inductor 10, the mounting bracket 60, the first controller device 70, and the second controller device 74 shown in FIG. 7 arranged on a substrate S.

The first controller device 70 and the second controller device 74 are preferably included in a power supply circuit similar to the power supply circuit 40 shown in FIG. 1A or a power supply circuit similar to the power supply circuit 40' shown in FIG. 1B. However, instead of a single controller device 30 as shown in FIGS. 1A and 1B, two separate controller devices are provided, for example, according to design requirements of a power supply circuit or other circuit that includes a critical current path. Preferably, the first controller device 70 includes a first switching element similar to the first switching element S1 or S1' of the controller device 30, and the second controller device 74 includes a second switching element similar to the second switching element S2 of the controller device 30. Accordingly, a first contact pad 72 of the first controller device 70 provides an electrical connection to the first switching element, and a second contact pad 76 of the second controller device 74 provides an electrical connection to the second switching element.

As shown in FIG. 7, the mounting bracket 60 includes a first leg 61, a second leg 62, and a third leg 63. Preferably, the first leg 61, second leg 62, and third leg 63 are arranged at different positions with respect to the inductor 10 (for example, at different sides or at different corners of the inductor 10) to help ensure a stable and secure mechanical and electrical connection between the inductor 10 and the first and second controller devices 70 and 74, and between the inductor 10 and the substrate S (e.g., a printed circuit board) upon which the inductor 10 is mounted. More specifically, the first leg 61 is preferably arranged to be connected to the substrate S, and the second leg 62 and the third leg 63 are preferably arranged to be connected to the first and second contact pads 72 and 76 of the first and second controller devices 70 and 74. Preferably, a second leg support 64 at the end of the second leg 62 and a third leg support 65 at the end of the third leg 63 are arranged to be connected to the substrate S to mechanically support the inductor 10 so that pressure is not applied to the first and second contact pads 72 and 76. Accordingly, the second leg 62 and the third leg 63 provide zero-length or near-zero-length leads to connect the inductor 10 to the first and second controller devices 70 and 74.

The first leg 61, second leg 62, third leg 63, the second leg support 64, and the third leg support 65 of the mounting bracket 60 are preferably electrically and mechanically connected to the first contact pad 72 of the first controller device 70, the second contact pad 76 of the second controller device 74, and the substrate S using a connection similar to that described above with regard to the mounting bracket 20.

As shown in FIGS. 10A-10C, the exposed segment D1, or lead, of the high-current path in the second leg 62 and third leg 63 is short, thereby providing good EMI performance, high efficiency, and reduced heat generation and parasitic elements. Further, although FIGS. 7 and 10A-10C show a short distance between the inductor 10 and the first and second controller devices 70 and 74, the inductor 10 may be arranged directly adjacent to the first and second controller devices 70 and 74. In particular, the first inductor body 11 and the second inductor body 12 may be arranged to touch at least one of the first and second controller devices 70 and 74, such that the gap 13 is directly adjacent to one of the first and second contact pads 72 and 76, in order to reduce the distance between the inductor 10 and the first and second controller devices 70 and 74 to zero or nearly zero, within manufacturing tolerances.

Figure 8:
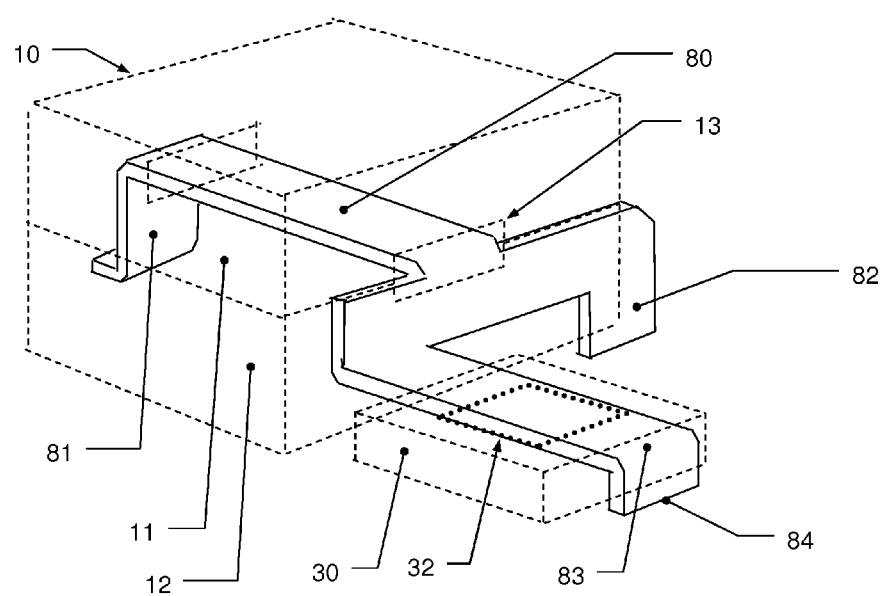
FIG. 8 is a top perspective view of an inductor and a mounting bracket arranged on a controller device according to a preferred embodiment of the present invention.
Figure 11A:
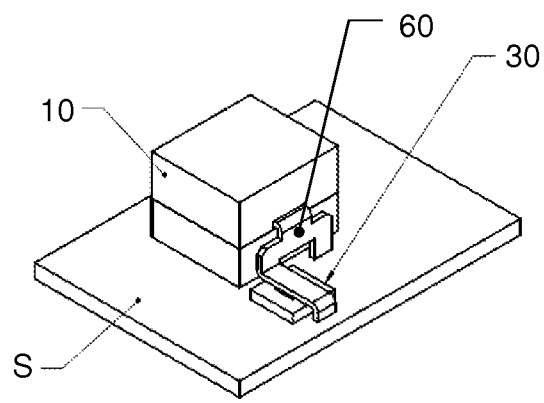
FIGS. 11A-11C show the inductor, the mounting bracket, and the controller device shown in FIG. 8 arranged on a substrate.
Figure 11B:
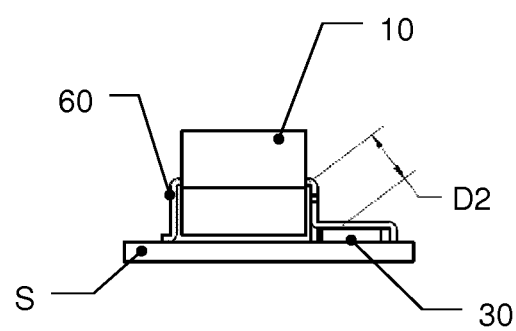
Figure 11C:
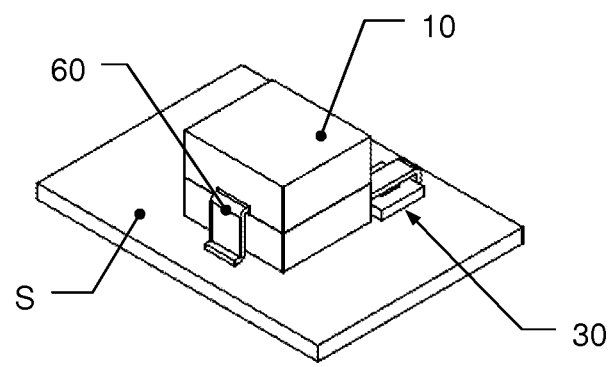

FIGS. 8 and 11A-11C show the inductor 10 with a mounting bracket 80 according to a preferred embodiment of the present invention. In particular, FIG. 8 is a top perspective view of the inductor 10 and the mounting bracket 80 arranged on the controller device 30 of FIGS. 1A and 1B. FIGS. 11A-11C show the inductor 10, the mounting bracket 80, and the controller device 30 shown in FIG. 8 arranged on a substrate S.

As shown in FIG. 8, the mounting bracket 80 includes a first leg 81, a second leg 82, and a third leg 83. Preferably, the first leg 81, second leg 82, and third leg 83 are arranged at different positions with respect to the inductor 10 (for example, at different sides or at different corners of the inductor 10) to help ensure a stable and secure mechanical and electrical connection between the inductor 10 and the controller device 30, and between the inductor 10 and the substrate S (e.g., a printed circuit board) upon which the inductor 10 is mounted. More specifically, the first leg 81 and the second leg 82 are preferably arranged to be connected to the substrate S, and the third leg 83 is preferably arranged to be connected to the contact pad 32 of the controller device 30. Preferably, a third leg support 54 at the end of the third leg 53 is arranged to be connected to the substrate S to mechanically support the inductor 10 and so that pressure is not applied to the contact pad 32. Accordingly, the third leg 83 provides a zero-length or near-zero-length lead to connect the inductor 10 to the controller device 30.

The first leg 81, second leg 82, third leg 83, and the third leg support 84 of the mounting bracket 80 are preferably electrically and mechanically connected to the contact pad 32 of the controller device 30 and the substrate S using a connection similar to that described above with regard to the mounting bracket 20.

As shown in FIGS. 11A-11C, the exposed segment D2, or lead, of the high-current path in the third leg 83 is short, thereby providing good EMI performance, high efficiency, and reduced heat generation and parasitic elements. Further, although FIG. 8 shows a short distance between the inductor 10 and the controller device 30, the inductor 10 may be arranged directly adjacent to the controller device 30 (in particular, directly adjacent to the contact pad 32 of the controller device 30), in order to reduce the distance between the inductor 10 and the controller device 30 to zero or nearly zero, within manufacturing tolerances.

Figure 12A:
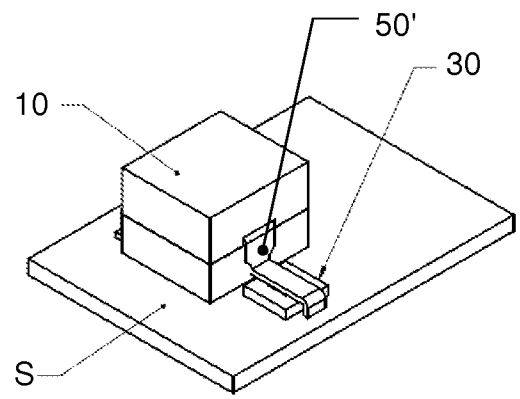
FIGS. 12A-12C show an inductor, a mounting bracket, and a controller device arranged on a substrate according to a preferred embodiment of the present invention.
Figure 12B:
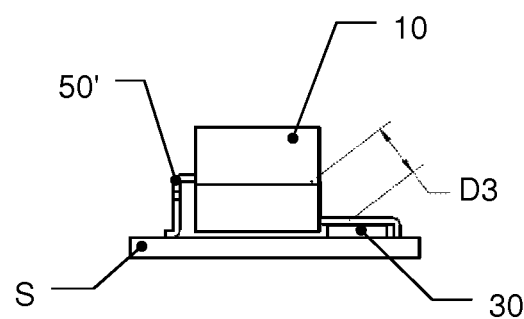
Figure 12C:
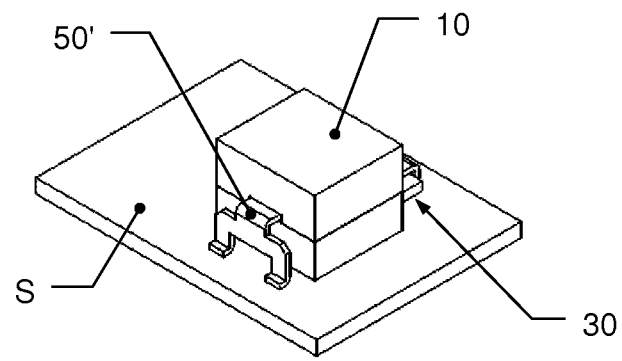

FIGS. 12A-12C show the inductor 10, a mounting bracket 50', and the controller device 30 arranged on a substrate S according to a preferred embodiment of the present invention. As shown in FIGS. 12A-12C, the mounting bracket 50' provides a horizontal mounting for the inductor 10 that is similar to the vertical mounting shown in FIGS. 5A-6 and 9A-9C. The mounting bracket 50' preferably includes first and second legs arranged at a side of the inductor 10 opposite to the controller device 30, and a third leg that electrically connects the mounting bracket 50' to the controller device 30 and that mechanically connects the mounting bracket 50' to the substrate S to support the inductor 10. As shown in FIGS. 12A-12C, the exposed segment D3, or lead, in the high-current path of the mounting bracket 50' between the inductor 10 and the controller device 30 is short, thereby providing good EMI performance, high efficiency, and reduced heat generation and parasitic elements.

Figure 13A:
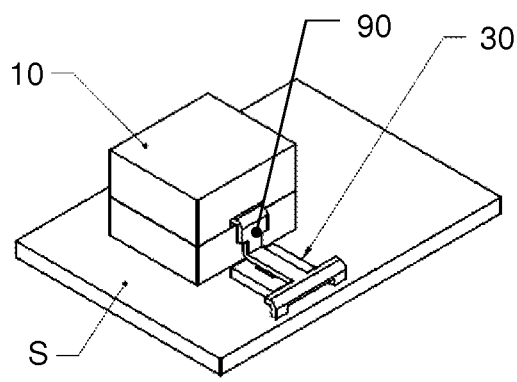
FIGS. 13A-13C show an inductor, a mounting bracket, and a controller device arranged on a substrate according to a preferred embodiment of the present invention.
Figure 13B:
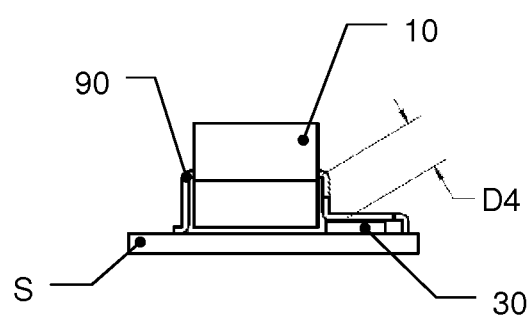
Figure 13C:
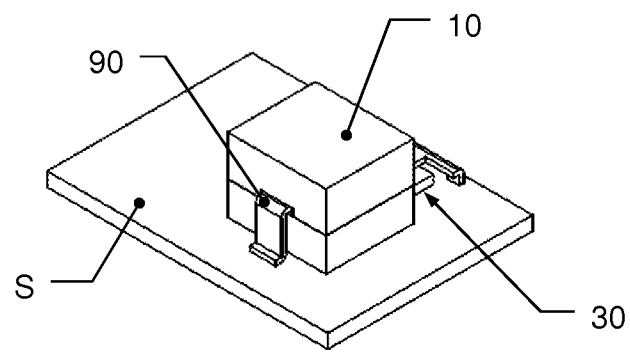
Figure 14:
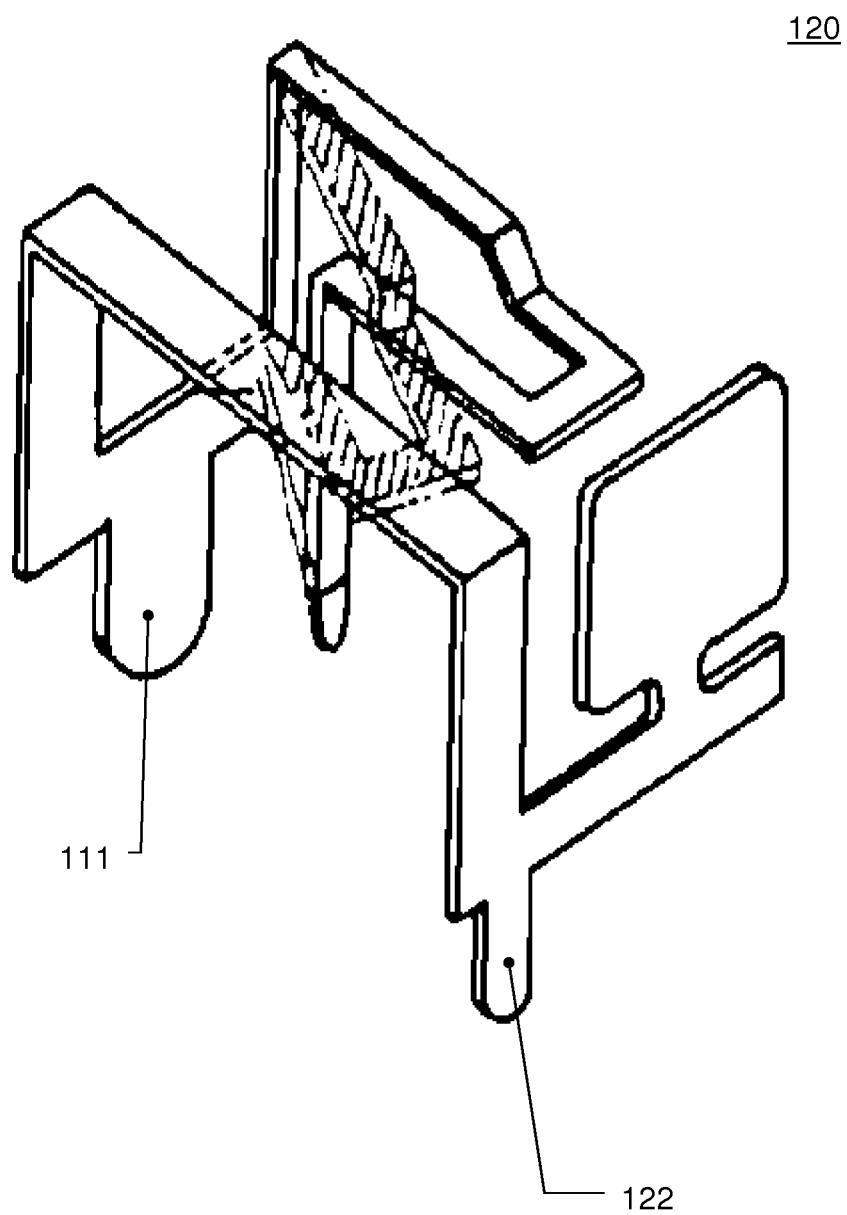
FIG. 14 is a perspective view of a portion of a conventional inductance line.

FIGS. 13A-13C show an inductor 10, a mounting bracket 90, and a controller device 30 arranged on a substrate S according to a preferred embodiment of the present invention. As shown in FIGS. 13A-13C, the mounting bracket 90 preferably includes a first leg arranged a side of the inductor 10 opposite to the controller device 30 and a bridging portion between the inductor 10 and the controller device 30 that electrically connects the mounting bracket 90 to the controller device 30. Further, the mounting bracket 90 includes second and third legs that mechanically connect the mounting bracket 90 to the substrate S to support the inductor 10. As shown in FIGS. 13A-13C, the exposed segment D4, or lead, in the high-current path of the mounting bracket 90 between the inductor 10 and the controller device 30 is short, thereby providing good EMI performance, high efficiency, and reduced heat generation and parasitic elements.

According to the preferred embodiments of the present invention, at least one leg of a mounting bracket of an inductor may be soldered directly to a contact point of a controller device (e.g., an integrated circuit) so as to reduce the length of at least one lead of the inductor to zero or near-zero, within manufacturing tolerances, to provide good EMI performance, high efficiency, and reduced heat generation and parasitic elements in a circuit that includes the inductor. However, the preferred embodiments are not limited thereto. For example, the preferred embodiments of the present invention may also be applied to other critical circuit paths, such as connections between transformers and power FETs, connections between FETs or rectifiers and output pins, or any high current connections that is susceptible to heating.

As shown in FIGS. 1A and 1B, the power supply circuits 40 and 40' may be implemented as a buck converter. However, the preferred embodiments of the present invention are not limited thereto. For example, the power supply circuits 40 and 40' may be modified such that other power supply topologies may be used with the preferred embodiments of the present invention as described herein. More generally, the preferred embodiments of the present invention may be used in any high-current application that includes an inductor.

The mounting brackets 20, 50, 50', 60, 80, and 90 according to the preferred embodiments of the present invention preferably include copper or a copper alloy material. Furthermore, the copper or copper alloy material of the mounting brackets 20, 50, 50', 60, 80, and 90 is preferably plated with tin or a tin alloy material. Further, although the mounting brackets 20, 50, 50', 60, 80, and 90 according to the preferred embodiments of the present invention are shown in FIGS. 2A-13C as each being formed as a single, continuous element, the mounting brackets 20, 50, 50', 60, 80, and 90 are not limited thereto. The mounting brackets 20, 50, 50', 60, 80, and 90 may be formed using multi-piece construction, for example, to include a different conducting material for one or more of the legs.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An inductor assembly comprising:
an inductor body including an inductor core; and
a mounting bracket including a first leg, a second leg, and a third leg; wherein
a portion of the mounting bracket passes through the inductor body;
at least one of the first leg and the second leg of the mounting bracket is arranged to be mounted on a substrate; and
the third leg of the mounting bracket is arranged to be mounted to a pad on a top surface of an electrical component mounted on the substrate, is arranged to form a direct electrical connection with the electrical component when the third leg is mounted on the electrical component, and is arranged such that an end portion of the third leg is connected to the substrate when the third leg is mounted on the electrical component.

2. The inductor assembly of claim 1, wherein the third leg is not connected to ground.

3. The inductor assembly of claim 1, wherein at least one of the first leg, the second leg, and the third leg is arranged at a side of the inductor body opposite to a side of the inductor body that includes another one of the first leg, the second leg, and the third leg.

4. The inductor assembly of claim 1, wherein the mounting bracket includes copper or a copper alloy material.

5. The inductor assembly of claim 4, wherein the mounting bracket is plated with tin or a tin alloy material.

6. The inductor assembly of claim 1, wherein the mounting bracket is defined by a single monolithic element.

7. The inductor assembly of claim 1, wherein the inductor body includes a U-shaped or substantially U-shaped core inductor.

8. A circuit assembly comprising:
a substrate;
an electrical component mounted on the substrate and including a pad on the top surface of the electrical component; and
an inductor assembly connected to the substrate; wherein the inductor assembly includes:
an inductor body including an inductor core; and
a mounting bracket including a first leg, a second leg, and a third leg; wherein
a portion of the mounting bracket passes through the inductor body;
at least one of the first leg and the second leg of the mounting bracket is arranged to be mounted on a substrate; and
the third leg of the mounting bracket is connected to the pad, forms a direct electrical connection with the electrical component, and is arranged such that an end portion of the third leg is connected to the substrate.

9. A circuit assembly comprising:
a substrate;
an inductor assembly including an inductor body and a mounting bracket, the mounting bracket includes a first leg, a second leg, and a third leg; and
a first electronic device and a second electronic device mounted on the substrate, each of the first electronic device and the second electronic device includes a pad on a surface thereof; wherein
the first leg of the mounting bracket is mounted on the substrate;
the second leg of the mounting bracket is directly electrically connected to the pad of the first electronic device;
the third leg of the mounting bracket is directly electrically connected to the pad of the second electronic device; and
an end portion of each of the second leg and the third leg of the mounting bracket is mounted on the substrate.

10. The circuit assembly of claim 9, wherein the first electronic device includes a control circuit arranged to switch at least one switching element.

11. The circuit assembly of claim 9, wherein the first electronic device is a diode.

12. The circuit assembly of claim 9, wherein the circuit assembly is a DC-to-DC converter.

13. The circuit assembly of claim 12, wherein the DC-to-DC converter is a buck converter.

14. The circuit assembly of claim 10, wherein the at least one switching element is a transistor.

15. The circuit assembly of claim 14, wherein the at least one switching element is a field-effect transistor.

\* \* \* \* \*